United States Patent

Myers et al.

[11] Patent Number: 6,072,361
[45] Date of Patent: Jun. 6, 2000

[54] WIDEBAND CLASS-S MODULATOR AND METHOD THEREFOR

[75] Inventors: Ronald Gene Myers, Scottsdale; Bernard Eugene Sigmon, Gilbert, both of Ariz.

[73] Assignee: Motorola, Inc., Schaumburg, Ill.

[21] Appl. No.: 08/753,630

[22] Filed: Nov. 27, 1996

[51] Int. Cl.[7] .................................................. H03F 3/38
[52] U.S. Cl. .............................................. 330/10; 330/251
[58] Field of Search .................................. 330/10, 207 A, 330/251; 332/109, 110

[56] References Cited

U.S. PATENT DOCUMENTS 4,949,048  8/1990  Tokumo et al. ......................... 330/10
5,479,337  12/1995  Voight .................................. 330/10 X

OTHER PUBLICATIONS

An article entitled "RF Modulators, Class–S High–Efficiency Amplitude Modulator", by Frederick H. Raab and Daniel J. Rupp, from May 1994 RF Design.

*Primary Examiner*—Steven Mottola
*Attorney, Agent, or Firm*—Kevin K. Johanson; Dana B. LeMoine; Timothy J. Lorenz

[57] ABSTRACT

A class-S modulator (5) receives an input signal (10) having envelope information and pulse-width modulates the input signal (10) using a reference waveform (26) from a waveform generator (25). The envelope becomes a pulse-width modulated signal is level-shifted and amplified through a pre-driver (40). A driver (50) controls switches (60, 70) which drive an output (80) into a low-pass filter (90) wherein the envelope is restored to the amplified signal for driving a power amplifier in a wide-band transceiver.

18 Claims, 3 Drawing Sheets

WIDEBAND CLASS-S MODULATOR AND METHOD THEREFOR

TECHNICAL FIELD

This invention relates generally to radio frequency amplifiers, and in particular, to communication type amplifiers for amplifying an input signal having an envelope signal thereon.

BACKGROUND OF THE INVENTION

Radio communications systems require the use of amplifiers to boost signals to power levels suitable for transmission. Such increased levels are provided by transmitter power amplifiers. Power amplifiers require significant power to amplify signals for transmission and management of available power resources is essential for performance reasons. In communication transceivers having substantially unlimited available power. Power management is used primarily to reduce installation size and reduce heat generation. Power management is of more concern in portable transceivers where conservation of power and efficient use of that power translates directly into increased performance and customer satisfaction.

Because power amplifiers typically utilize a substantial amount of power, conservation and efficiency of power resources falls upon using high efficiency amplifier configurations and stages within the communication transceiver. Therefore amplifier components such as the intermediary amplifiers and modulators must conserve as much power as possible to improve overall portable transceiver usability between battery charges.

In addition to power conservation techniques, different types of amplifiers and modulators have differing levels of efficiency. Furthermore, amplifiers typically operate at power levels that are less than their maximum power and efficiency levels. Operation at these "backoff" levels further reduces the overall efficiency of the devices.

For example, operation in more than −6 dB backoff is commonly encountered in most applications. Most amplifiers exhibit low efficiency of operation in this region, e.g., <30%. Linear amplifiers typically operate at only about 20% efficiency or less when they are operated at −10 dB below their maximum power level.

When a device is operated in a linear mode, it dissipates considerably more power than when it is operated in a switching mode. Class-S modulators operate in the switching mode and therefore dissipate much less power and are therefore more conducive to portable communication applications.

Accordingly, there is a significant need for a method and apparatus for amplifying with a higher-efficiency an input signal having an envelope over a wide dynamic power range.

DESCRIPTION OF THE PREFERRED EMBODIMENTS

The present invention is a high-efficiency class-S modulator based upon pulse-width modulation techniques. An input signal having envelope information is input into this modulator and the envelope amplified prior to application to the subsequent power amplifier. In this technique, the detected envelope is amplified efficiently by a class-S modulator. The class-S modulator, comprises a portion of a higher level Envelope Elimination and Restoration (EER) amplifier described in an article "Class-S High-Efficiency Amplitude Modulator", RF Design Vol. 17, no. 5, pp. 20–74 May 1994 by Frederick H. Raab, Ph.D. and Daniel J. Rupp, both of Green Mountain Radio Research, herein incorporated by reference.

Figure 1:
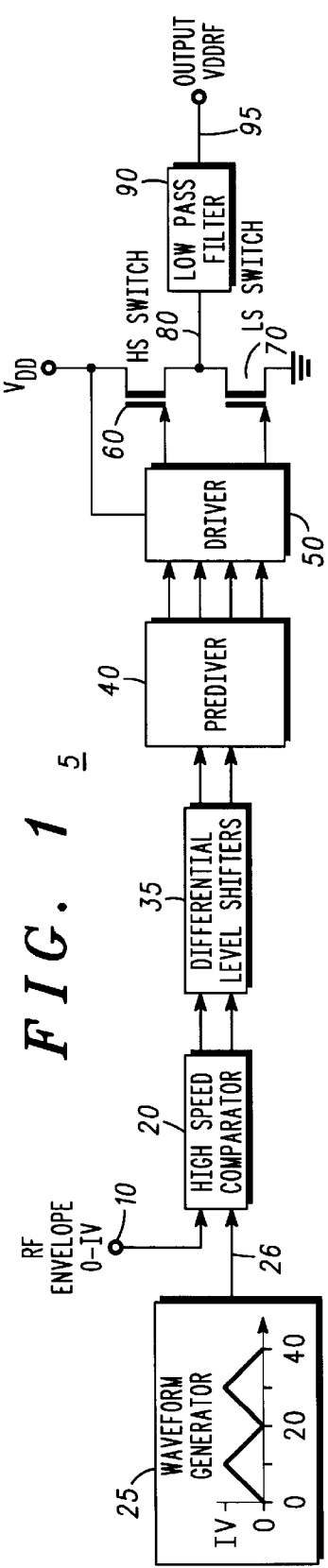
FIG. 1 depicts a block diagram of a class-S modulator of which the present invention may form a portion thereof.

FIG. 1 depicts a block diagram of a class-S modulator of which the present invention may form a portion thereof. Input signal 10 typically is an Amplitude Modulated (AM) signal having an envelope depicting information carried by input signal 10.

A waveform generator 25 provides a reference waveform 26 for an input to comparator 20. The reference waveform may be either a triangular waveform or sawtooth waveform. In the preferred embodiment, a triangular waveform is employed to prevent very high dv/dt and to balance switching delay in the comparison process at the leading and trailing edges of the pulses.

Comparator 20 senses the comparative changes to the input signals and reacts accordingly with the output signal. In the preferred embodiment, a high-speed comparator is used and provides the functions of pulse width modulation by comparing the input RF envelope to the triangular sampling waveform. Output pulse widths are proportional to the magnitude of the input signal RF envelope. In the preferred embodiment, comparator 20 provides differential output signals.

A level shifter 35 provides signal conditioning to the output signals of comparator 20. In the preferred embodiment, comparator output signals are at ECL levels that must be shifted to accommodate input drive levels prior to sending the signals to a pre-driver 40. Level shifter 35, in the preferred embodiment, also boosts the signal power level to drive pre-driver 40.

Pre-driver 40 provides signal conditioning and amplification for a driver 50. In the preferred embodiment, pre-driver 40 additionally generates paired differential outputs for driving discrete components in driver 50. Driver 50 controls switching of switches 60 and 70.

Switches 60 and 70 provide high switching speed, low on-resistance and require fairly low gate drive power. In the preferred embodiment, all switches in both the power output and driver stages are N channel Gallium Arsenide field effect transistors which operate in the depletion mode. Switches 60 and 70 generate output 80 which is a pulse-width modulated signal. The high-level pulse-width modulated signal is converted into the desired analog voltage output by low-pass filter 90. The filter presents a high impedance to the switching frequency and its harmonics. This prevents such harmonics from reaching the load and also from generating significant currents through the switches. Output 95 then drives the power amplifier for generating propagation power levels in the communication system.

Typically, in a class-S modulator as described, the sampling frequency is 5–6 times the bandwidth to minimize distortion. In the preferred embodiment as shown, the modulator operates at an approximate bandwidth of 10 MHz and the modulator efficiency approximates an 80%–90% range.

Figure 2:
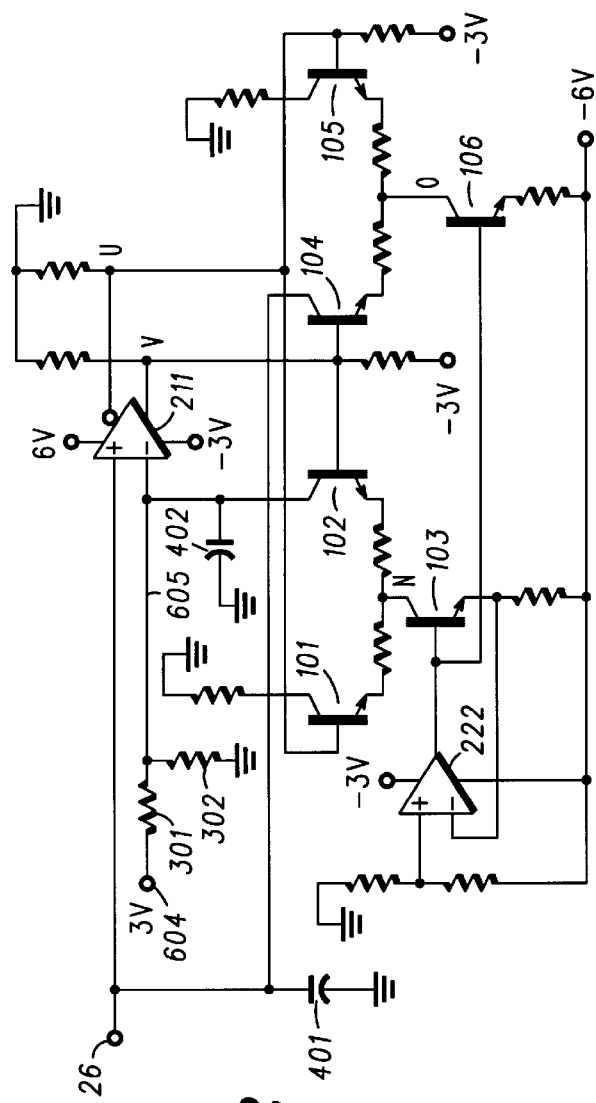
FIG. 2 depicts a schematic diagram of a waveform generator, in accordance with a preferred embodiment of the present invention.
Figure 3:
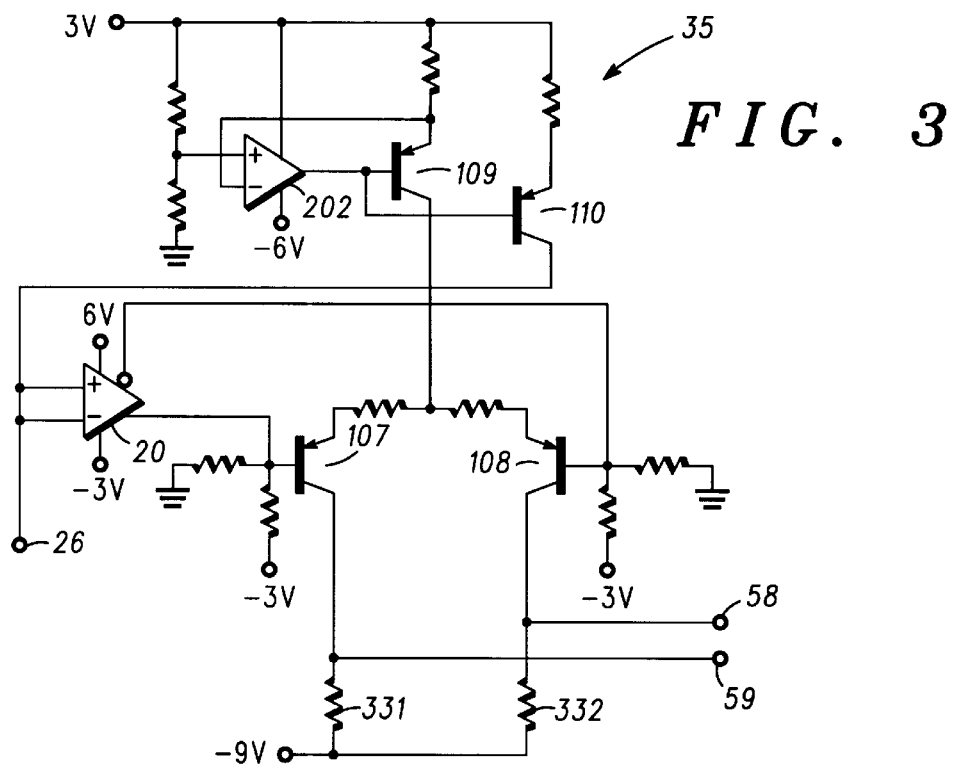
FIG. 3 depicts a schematic diagram of a comparator and a level shifter, in accordance with a preferred embodiment of the present invention.

FIG. 2 depicts a schematic diagram of a waveform generator 25, in accordance with a preferred embodiment of the present invention. In the preferred embodiment, a 1 Vpp, 50 MHz triangular reference waveform 26 is generated by comparator 211, two current mode differential switching stages, 101, 102, 104, and 105, three current sources 103, 106, 110 (FIG. 3), a timing capacitor 401, and a reference voltage 604. Such waveforms are generated when a cycle starts after comparator 211 switches state and with both inputs at 0 volts. Switching stage 102 is switched off and the reference voltage increases to 1 volt at a rate controlled by capacitor 402 to reduce noise. The only rate requirement is that voltage signal 605 must be settled at 1 volt before voltage 606 arrives at one half the cycle time, 10 nsec in the preferred embodiment. At that same part of the cycle, switching stage 104 is also switched off and the voltage 606 increases at a rate of 1 volt per 10 nsec as controlled by capacitor 401 and the approximate 5 mA charging current from current source 110. When reference waveform 26 reaches 1 volt, one-half the cycle is complete and comparator 211 switches state. At that point, switching stage 102 is switched on and the constant current provided by current source 103 is pulled from divider resistors 301 and 302 to decrease voltage signal 605 to 0 volts. As described, capacitor 402 controls the rate. Switching stage 104 is also switched on and the constant current provided by current source 106 is pulled from capacitor 401 and current source 110 (FIG. 3). The level of reference waveform 26 decreases at 1 volt per 10 nsec, in the preferred embodiment, until it reaches 0 volts where the last half-cycle is complete and comparator 211 again switches state and the sequence repeats.

FIG. 3 depicts a schematic diagram of comparator 20 and level shifter 35, in accordance with a preferred embodiment of the present invention. In the preferred embodiment, level shifter 35 provides −9 and −6 volt input drive levels to pre-drivers 40 which require fast switching speed. Such functionality is provided by differential current mode switching stages 107 and 108. Values for resistors 331 and 332 are determined by switching time, pre-driver input capacitance and the output capacitance of switching stages 107 and 108. Constant current feed is provided by the current source 109 and amplifier 202. In the preferred embodiment, this stage operates from +3 and −9 volt supplies and is driven by ECL levels from comparator 20.

Comparator 20 provides the function of pulse-width modulation. In the preferred embodiment, comparator 20 is a fast voltage comparator, such as a SPT9689 (manufactured by Signal Processing Technologies, Inc., Colorado Springs, Colo.) that dissipates approximately 400 mWatts and a custom device may provide even more favorable power management. In the preferred embodiment, pulse-width modulation is accomplished by comparing the input RF envelope to the 1 Vpp, 50 MHz triangular sampling waveform. Output pulses from comparator 20 would then be at a 50 MHz rate with the pulse width being proportional to the magnitude of the input RF envelope. The required sampling rate of 5–6 times the RF envelope bandwidth provides a modulator bandwidth of about 10 MHz.

Figure 4:
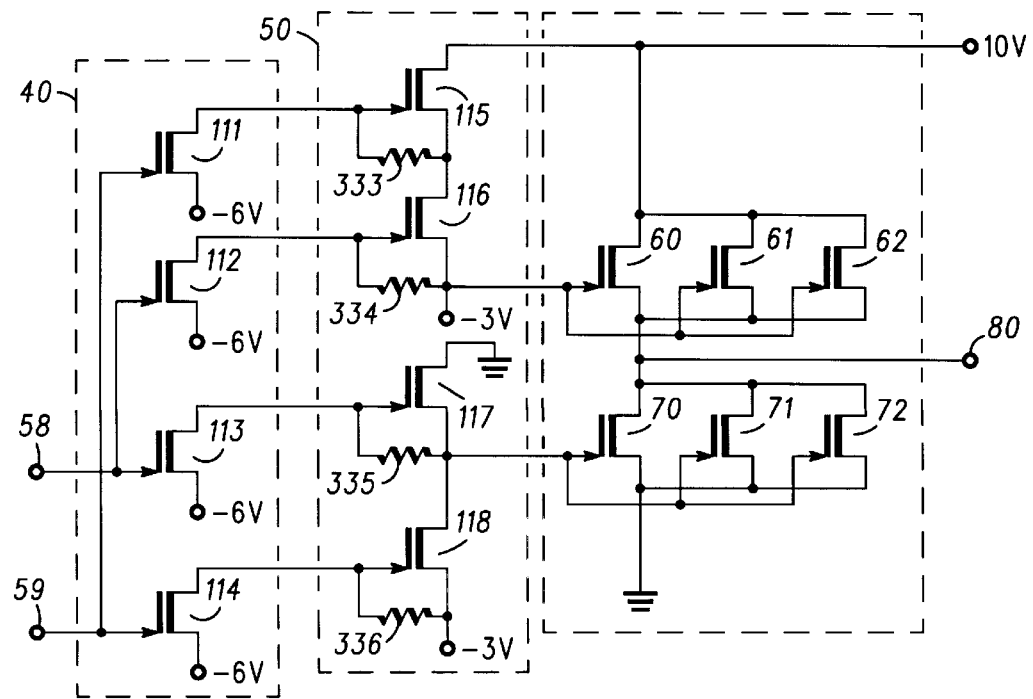
FIG. 4 depicts a schematic diagram of a pre-driver, driver and switching stages, in accordance with a preferred embodiment of the present invention.

FIG. 4 depicts a schematic diagram of a pre-driver, driver and switching stages, in accordance with a preferred embodiment of the present invention. Switches in both the power output and driver stages are N-channel GaAs field effect transistor which operate in the depletion mode. These devices provide high switching speed, low on-resistance, and require fairly low gate drive power. A gate-to-source voltage of 0–3 volts turns the device on and off, respectively. The gate input impedance is predominantly capacitance, requiring a gate drive power of $$P_g = C_{in} * V_{gs}^2 * F_s$$

Where $C_{in}$ equals gate input capacitance, $V_{gs}$ equals on-to-off gate-to-source voltage swing and $F_s$ equals switching frequency.

To maximize efficiency and provide fast switching, the driver must deliver high peak current only during switching during the pulse edges. This function is provided by the FETs operating from the appropriate voltage levels.

An output totem pole stage has high-side switches and low-side switches. Each switch is implemented by paralleling transistors to provide low on-resistance and greater output power capability, but at a loss of drive power. Paralleling improves efficiency, but there is a point of diminishing return as the number of devices increases. In the preferred embodiment, three parallel devices, switches 60–62 and switches 70–72, are an preferred choice for most designs.

Low-side switches 70–72 operate grounded-source, in the preferred embodiment, and are driven by the totem pole driver stage comprised of switches 117 and 118. This driver stage operates between ground and −3 volts and generally dissipates power only during switching. Such an arrangement minimizes power loss and improves drive to the output stage with a relatively large input capacitance. High-side switches 60–62 operate with sources referenced to output 80 and are driven by the totem pole stage comprised of switches 115 and 116. Operation of the high-side switches is similar to that of the low-side switches, but the drive levels are −3 volts and Vdd. Bootstrapping circuits are generally used to drive the high-side switches. However, in the preferred embodiment, instead of bootstrapping, the preferred embodiment uses a gate-to-source resistance to perform the FET turn-on function with fairly low power loss and less complexity. The resistance value is optimized to minimize power loss, and meet the switching time requirement as determined by the driver gate input capacitance.

Driver 50 gate-to-source voltage levels are provided by pre-driver 40 comprising switches 111–114 and the gate-to-source resistors 333–336, and a −6 volt supply, in the preferred embodiment. When a pre-driver transistor is off, current does not flow in the resistor and the gate-to-source voltage is zero, turning the driver on. Conversely, when any pre-driver transistor is on, current flows in the resistor to provide −3 volts gate-to-source and the driver is off. Dissipation in the pre-driver and driver transistors is very low, but power is lost in the gate to source resistors.

Figure 5:
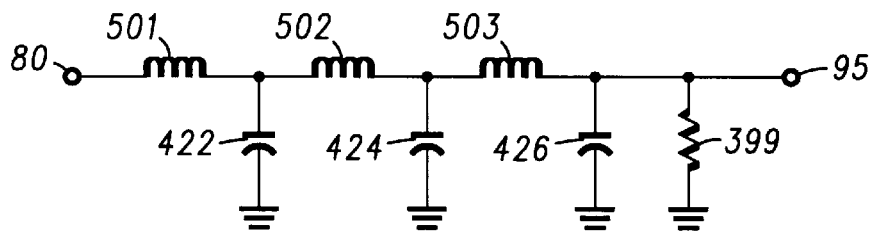
FIG. 5 depicts a schematic of a low-pass filter, in accordance with a preferred embodiment of the present invention.

FIG. 5 depicts a schematic of low-pass filter 90, in accordance with a preferred embodiment of the present invention. A 6-pole Tchebyscheff low-pass output filter with a 0.1 dB flatness response over the 10 MHz pass band provides 60 dB attenuation at the 50 MHz sampling frequency. Such a filter provides very low group delay variation over the 10 MHz pass band. Low-pass filter 90 comprises inductors 501–503, and capacitors 422, 424, Although a time delay, 37.3 nsec, is incurred and provisions must be made to add an equal amount of delay in the amplifier path, such a delay is not insurmountable.

Typical values for the previously described preferred embodiment are included in Table I and are not intended to be limiting and may be varied, as known by those of skill in the art, for different signal characteristics and desired results.

TABLE I

| 101,102, 104,105 | MMBR571 | 20 | SP9689 | 111–114 | FET mm 1 |
|---|---|---|---|---|---|
| 103,106 | 2N2222A | 107,108 | NE88900 | 115–118 | FET mm 2.4 |
| 211 | SP9689 | 109,110 | 2N2907A | 60–62, 70–72 | FET mm 16 |
| 222 | MC33072 | 202 | MC33072 | 333–336 | 52.3Ω |
| 301 | 301Ω | 331,332 | 200Ω | 422 | 9300 pF |
| 302 | 150Ω | 424 | 8600 pF | | |
| 401 | 47 pF | 501,503 | 15 nH | 426 | 3000 pF |
| 402 | 27 pF | 502 | 20 nH | | |

Figure 6:
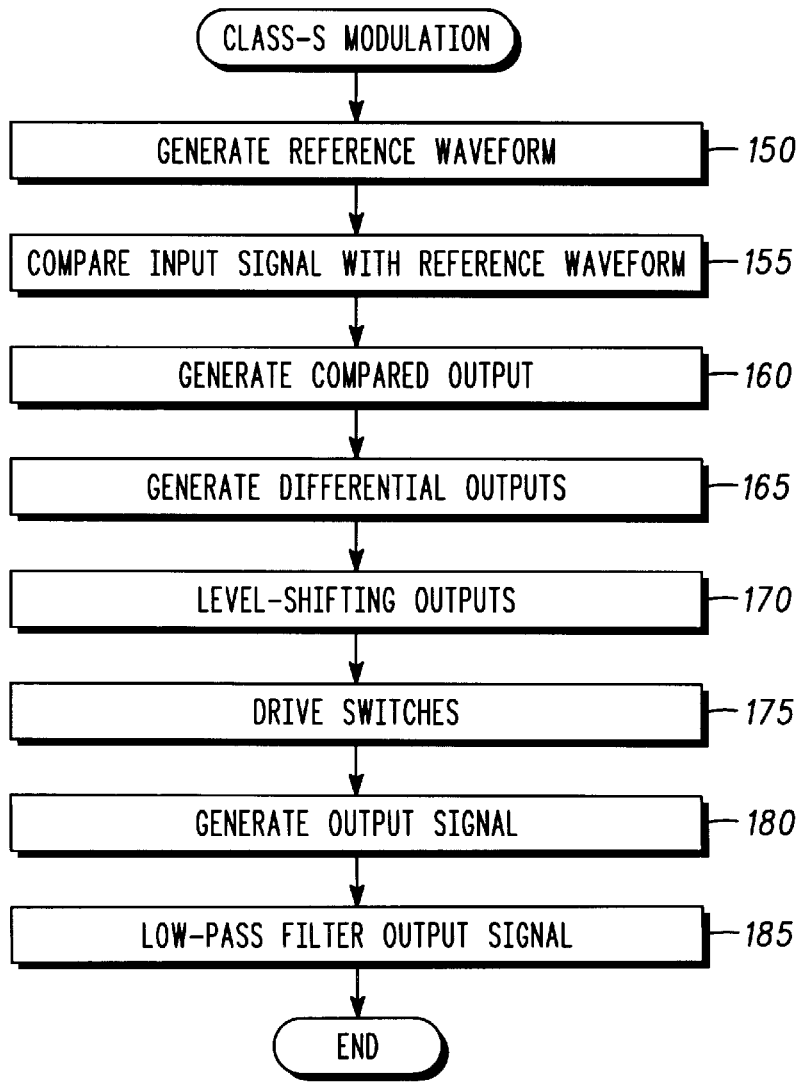
FIG. 6 is a flowchart for amplifying an input signal, in accordance with the present invention.

FIG. 6 is a flowchart for amplifying an input signal, in accordance with the present invention. In the preferred embodiment, a class-S modulator performs the following tasks.

A task 150 generates a reference waveform from waveform generator 25. In the preferred embodiment, reference waveform 26 is a triangle waveform, however, nothing prevents the reference waveform from being a sawtooth or other waveforms.

A task 155 compares input signal 10 with reference waveform 26 with input signal 10 being the signal undergoing amplification. A task 160 generates a compared output from input signal 10 and reference waveform 26 with the compared output signal being a pulse-width modulated signal.

A task 165 generates differential outputs of the compared output signal for level-shifting by a task 170. A task 175 drives switches for generating an output signal in a task 180.

A task 185 low-pass filters the output signal to restore the envelope of the input signal to the output from the switches.

The present invention has been described above with reference to a preferred embodiment. However, those skilled in the art will recognize that changes and modifications may be made in this preferred embodiment without departing from the scope of the present invention.

What is claimed is:

1. A class-S modulator for amplifying an input signal having envelope information, comprising:
    a comparator having a first input to receive said input signal, a second input to receive a reference waveform, and differential compared outputs;
    a differential level shifter having inputs coupled to said differential compared outputs of said comparator, and level shifted outputs;
    a driver including at least one input coupled to said level shifted outputs, a first differential output, and a second differential output;
    a switching stage including a high-side switch controlled by said first differential output, and a low-side switch controlled by said second differential output, said high-side and said low-side switches being configured in a totem-pole arrangement to generate a switch output; and
    a low-pass filter coupled to said switch output to restore an amplified envelope of said input signal.

2. The class-S modulator as recited in claim 1, wherein said comparator pulse-width modulates said input signal with said reference waveform.

3. The class-S modulator as recited in claim 1, further comprising a pre-driver coupled to said level shifted outputs of said differential level shifter and said at least one input of said driver for providing differential signals to said driver.

4. The class-S modulator as recited in claim 1, wherein said reference waveform is a triangular waveform.

5. The class-S modulator as recited in claim 1, further comprising a waveform generator to generate said reference waveform.

6. The class-S modulator as recited in claim 1, wherein said low-side switch and said high-side switch are each comprised of at least one field effect transistor.

7. The class-S modulator as recited in claim 1, wherein said low-pass filter is a Tchebyscheff low-pass filter.

8. An amplifier for amplifying an input signal by eliminating an envelope of said input signal and then restoring said envelope to an output signal, said amplifier comprising:
    a comparator having a first input to receive said input signal, a second input to receive a reference waveform, and differential compared outputs;
    a differential level shifter having inputs coupled to said differential compared outputs of said comparator, and level shifted outputs;
    a driver including at least one input coupled to said level shifted outputs, a first differential output, and a second differential output;
    a switching stage including a high-side switch controlled by said first differential output, and a low-side switch controlled by said second differential output, said high-side and said low-side switches being configured in a totem-pole arrangement to generate a switch output; and
    a low-pass filter coupled to said switch output to restore an amplified envelope of said input signal.

9. The amplifier as recited in claim 8, wherein said comparator pulse-width modulates said input signal with said reference waveform.

10. The amplifier as recited in claim 8, further comprising a pre-driver coupled to said level shifted outputs of said differential level shifter and said at least one input of said driver for providing differential signals to said driver.

11. The amplifier as recited in claim 8, wherein said reference waveform is a triangular waveform.

12. The amplifier as recited in claim 8, further comprising a waveform generator to generate said reference waveform.

13. The amplifier as recited in claim 8, wherein said low-side switch and said high-side switch are each comprised of at least one field effect transistor.

14. The amplifier as recited in claim 8, wherein said low-pass filter is a Tchebyscheff low-pass filter.

15. A method for amplifying an input signal having envelope information, said method comprising the steps of:
    comparing said input signal to be amplified with a reference waveform;
    generating differential compared output signals from said input signal and said reference waveform;
    level shifting said differential compared output signals to produce level shifted outPut signals;
    driving at least one switch with said level shifted output signals;
    said at least one switch generating a switch output from said compared output signal; and
    low-pass filtering said switch output to restore said envelope.

16. The method as recited in claim 15, wherein said generating a compared output step comprises the step of pulse-width modulating said input signal with said reference waveform.

17. The method as recited in claim 15, further comprising a step of providing a waveform generator to generate said reference waveform.

18. The method as recited in claim 15 further comprising the step of generating a triangular waveform as said reference waveform.

* * * * *